United States Patent [19]

Sakurada et al.

[11] Patent Number: 4,607,273
[45] Date of Patent: Aug. 19, 1986

[54] POWER SEMICONDUCTOR DEVICE

[75] Inventors: Shuroku Sakurada, Hitachi; Hitoshi Matsuzaki, Mito; Yasuhiko Ikeda; Takehiro Ohta, both of Hitachi, all of Japan

[73] Assignee: Hitachi, Ltd., Tokyo, Japan

[21] Appl. No.: 689,039

[22] Filed: Jan. 8, 1985

Related U.S. Application Data

[63] Continuation of Ser. No. 336,324, Dec. 31, 1981.

[30] Foreign Application Priority Data

Jan. 14, 1981 [JP] Japan ................................ 56-3164

[51] Int. Cl.$^4$ ........................................... H01L 29/74
[52] U.S. Cl. ................................. 357/38; 357/68; 357/52; 357/49; 357/54; 357/36; 357/34
[58] Field of Search .................. 357/38, 38 C, 38 E, 357/38 G, 38 R, 38 P, 68, 52, 49, 54, 36, 34

[56] References Cited

U.S. PATENT DOCUMENTS

| | | | |
|---|---|---|---|
| 2,981,877 | 4/1961 | Noyce | 357/68 |
| 3,453,503 | 7/1969 | Schulz et al. | 357/68 X |
| 3,609,460 | 9/1971 | Ollendorf et al. | 357/68 X |
| 3,878,553 | 4/1975 | Sirles et al. | 357/68 X |
| 3,964,090 | 6/1976 | Jakob | 357/38 |
| 4,092,703 | 5/1978 | Sueoka et al. | 357/38 |
| 4,298,879 | 11/1981 | Hirano | 357/68 X |

FOREIGN PATENT DOCUMENTS

| | | | |
|---|---|---|---|
| 2824133 | 12/1978 | Fed. Rep. of Germany | 357/38 R |
| 0063688 | 5/1977 | Japan | 357/38 G |
| 2039413 | 8/1980 | United Kingdom | 357/38 G |

*Primary Examiner*—Andrew J. James
*Assistant Examiner*—William A. Mintel
*Attorney, Agent, or Firm*—Antonelli, Terry & Wands

[57] ABSTRACT

A semiconductor device having a semiconductor region of a high impurity concentration which is exposed to one major surface of a semiconductor pellet and has a plurality of split areas, and one main electrode on the major surface which makes low ohmic contact with the semiconductor region and has a bonding pad area for lead connection, comprises the high impurity concentration region underlying the entirety of the main electrode inclusive of the bonding pad, and an insulating film interposed between the bonding pad and the semiconductor region. In a gate turn-off thyristor with a short-circuiting P base region, the semiconductor region constitutes an N emitter region and an area thereof underlying the insulating film prevents the cathode/gate short and current concentration by lateral resistance upon turning off the device by the gate bias. In a bipolar transistor, the semiconductor region constitutes an emitter.

18 Claims, 12 Drawing Figures

FIG. IA
PRIOR ART
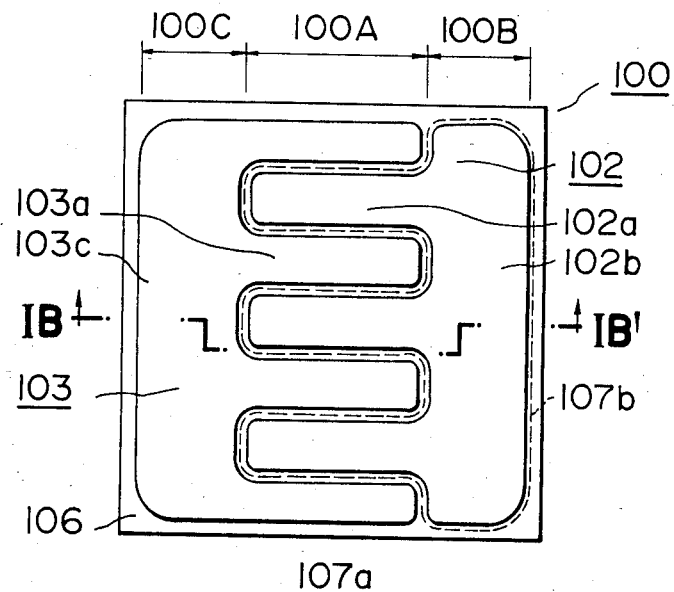
FIG. IB
PRIOR ART
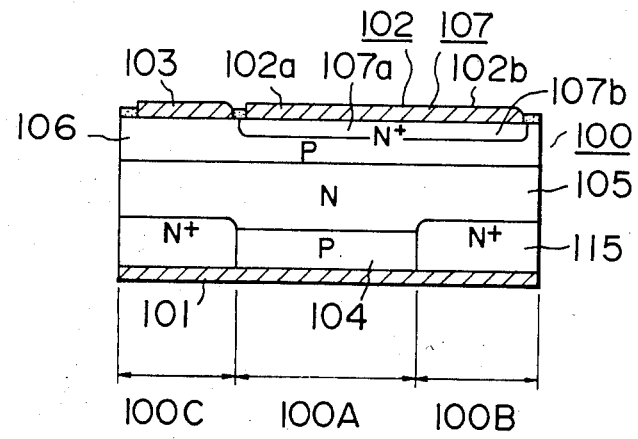

4,607,273

POWER SEMICONDUCTOR DEVICE

This application is a continuation of application Ser. No. 336,324 filed Dec. 31, 1981.

BACKGROUND OF THE INVENTION

The present invention relates to a bipolar semiconductor device and more particularly to a bipolar power semiconductor device such as a gate turn-off thyristor (hereinafter simply referred to as a GTO thyristor) or a power transistor.

GTO thyristors and power transistors which control on-off switching of a large current by a signal applied to their control terminals contribute to reduce size and weight and promote performances of inverter devices adapted for motor control with the aim of saving energy. Because of their usefulness in this regard, production is expected to be increased drastically in the future. In particular, the GTO thyristor is designed as a large capacity device capable of handling a large amount of power. Because of this, the GTO is playing the role of a leading product in the area of large-capacity switching devices.

In order to assure efficient control of a large current, it is effective to split the emitter. Proposals have hitherto been made including an interdigital or continuous emitter structure in which interdigitally split emitters merge into a common connecting area within a semiconductor and an over-oxide emitter structure in which split finger-like emitters are electrically connected with each other by means of an electrode which overlies an oxide film. The former, however, tends to suffer from current concentration when turning off the device by a gate bias and the latter has a tendency to cause short-circuiting between the cathode and the gate.

For details of the GTO thyristor, reference may be made to U.S. Pat. No. 3,239,728, a continuation-in-part application, filed on May 27, 1981, of U.S. patent application Ser. No. 13,808 filed on Feb. 22, 1979 and assigned to the same assignee as the present application, and a continuation application, filed on June 16, 1981, of U.S. patent application Ser. No. 74,523 filed on Sept. 11, 1979 and assigned to the same assignee as the present application.

SUMMARY OF THE INVENTION

An object of the present invention is to provide a semiconductor device of good characteristics having a large maximum controllable on-state current.

According to an aspect of the present invention, there is provided a power semiconductor device comprising an emitter region which continuously extends and underlies the bonding pad area of one main electrode connected to the emitter, and an insulating film of silicon oxide or the like interposed between the bonding pad area of the one main electrode and the emitter region.

The emitter region is registered with the one main electrode and is so formed as to include the projection of the one main electrode projected along the direction vertical to the substrate surface, and thereby short-circuiting of the one main electrode to the control electrode is prevented even in the event that a pinhole is created in the insulating film. The area of the emitter region which underlies the insulating film has a lateral resistance which is larger than, preferably sufficiently larger than, a longitudinal resistance of the area of the emitter region which makes direct contact to the one main electrode.

The power semiconductor device may be a GTO thyristor or a power bipolar transistor.

BRIEF DESCRIPTION OF THE DRAWINGS

FIG. 1A is a plan view, as seen from the cathode, of a prior art GTO thyristor;

FIG. 1B is a vertical sectional view of the GTO thyristor shown in FIG. 1A along the line IB—IB';

DESCRIPTION OF THE PREFERRED EMBODIMENTS

Figure 2A:
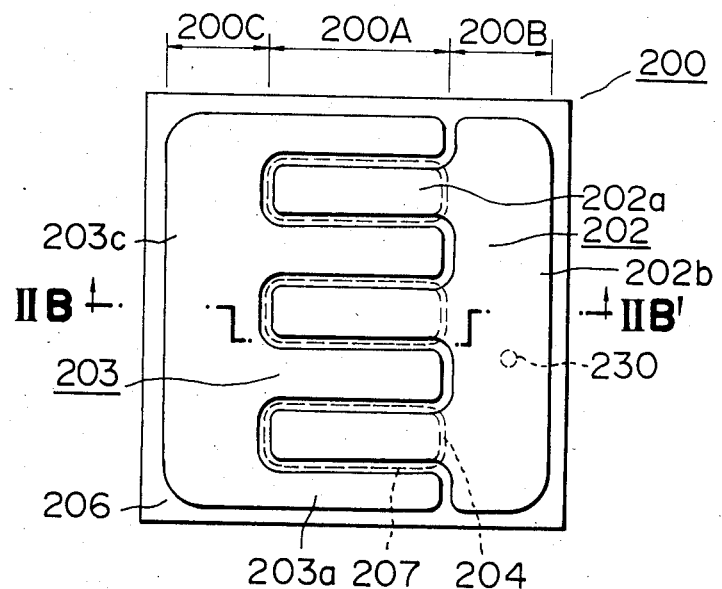
FIG. 2A is a similar plan view of another prior art GTO thyristor.

Before describing the present invention, relevant prior arts will be described.

FIG. 1A shows, in plan view, a prior art PNPN GTO thyristor and FIG. 1B shows the same in sectional form taken on line IB—IB' in FIG. 1A. The entire pellet block may generally be divided into a main current switching zone 100A, a cathode bonding pad zone 100B and a gate bonding pad zone 100C. The main current switching zone 100A includes a P emitter region 104 consisting of finger-like split emitter areas and an N emitter region 107 having finger-like split emitter areas 107a. Each of the split areas of the P emitter 104 is short-circuited with an N base region 105 through a surrounding N+ short-circuiting region 115 and an anode electrode 101 to constitute a short-circuited P emitter region. An N emitter region 107 formed within a P base region 106 includes a plurality of finger-like split emitter areas 107a and a connecting area 107b for electrically connecting the split emitter areas 107a. The P emitter region 104 opposes the split N emitter areas 107a of the N emitter region 107 through the N base region 105 and the P base region 106. For the purpose of illustration, FIG. 1B shows a sectional view taken on a bent line IB—IB shown in FIG. 1A. A sectional view related to that shown in FIG. 1B is as illustrated in U.S. patent application Ser. No. 74,523 filed on Sept. 11, 1979, for example. Namely, each of the N emitter areas 107a is off-set from each of the P emitter area 104. In the remaining Figures, the position of each split area of the P emitter region is also displaced from that of each split area of the N emitter region.

A cathode electrode 102 has substantially the same contour as that of the N emitter region 107 and makes low ohmic contact with almost the entire surface of the N emitter region 107. The cathode electrode 102 includes a bonding pad area 102b which overlies the connecting area 107b of the N emitter region 107. This structure will hereinafter be referred to as an N emitter continuous type. The bonding pad area 102b of the cathode electrode 102 has an area sufficient for lead bonding. Almost the entire area of a gate electrode 103 makes low ohmic contact with the P base region 106, and has interdigital areas 103a formed, in the switching zone 100A, on the P base region 106 and juxtaposed with interdigital cathode areas 102a and a bonding pad area 103c.

In the prior art GTO thyristor of the above construction, currents are concentrated in the connecting area 107b underlying the bonding pad area 102b when turning off a large current, and in extreme cases, the GTO thyristor is broken down. During the conduction of current, excess carriers in the N base region 105 prevail even in the bonding pad zones 100B and 100C other than the switching zone 100A and keep supplying current to the P base region even immediately after gate turn-off. Consequently, the connecting area 107b included in the N emitter region 107 and lying in the bonding pad zone 100B which is remote from the gate electrode 103 is kept conductive (not recovered) until the excess carriers in the N base region 105 are extinguished, with the result that a large current is concentrated in the connecting area 107b and the thyristor may become broken down. Accordingly, in the N emitter continuous type GTO thyristor as shown in FIG. 1 it is difficult to turn off a fairly large main current at a high speed. Therefore, the thyristor has a small maximum controllable on-state current.

Figure 2B:
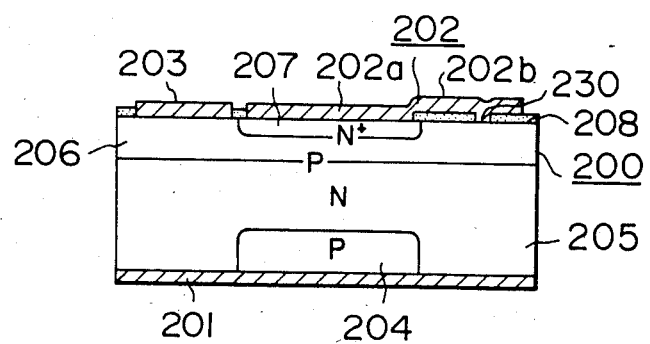
FIG. 2B is a vertical sectional view of the GTO thyristor shown in FIG. 2A along the line IIB—IIB'.

FIG. 2A shows, in plan form, another prior art GTO thyristor pellet 200 and FIG. 2B shows the same in sectional form taken along line IIB—IIB' in FIG. 2A. In this example, an N emitter region 207 has only split emitter areas and lies within only a switching zone 200A and does not extend to a bonding pad zone 200B. This structure will hereinafter be referred to as an N emitter split type. The split emitter areas of the N emitter region 207 make low ohmic contact with interdigital areas 202a of a cathode electrode 202, which are connected electrically with each other by means of a bonding pad area 202b. The cathode electrode terminates in the bonding pad area 202b which overlies a P base region 206 through an insulator of a silicon oxide film 208. This structure will hereinafter be referred to as an over-oxide structure. A gate electrode 203 has, like the gate electrode 103 shown in FIGS. 1A and 1B, interdigital areas 203a and a bonding pad area 203c. An anode electrode 201, a P emitter region 204 and an N base region 205, similar to those of FIGS. 1A and 1B, are provided. As in the example shown in FIGS. 1A and 1B, an N+ short-circuiting region may also be provided.

In the GTO thyristor of the above construction, the current concentration in the bonding pad zone 200B upon gate turn-off of the device can be reduced and an excellent turn-off characteristic can be obtained.

However, in the event that a pinhole as depicted at 230 in FIGS. 2A and 2B is created in the silicon oxide film 208 within the bonding pad zone 200B during manufacture process, the bonding pad 202b of the cathode electrode 202 accidentally comes in contact with the underlying P base region 206. This is followed by short-circuiting of the gate electrode 203 with the cathode electrode 202 through the P base region 206. As a result, the gate bias will not efficiently be applied to the P base region 206, and both the gate turn-on and gate turn-off. The inventors have found that the majority of defective characteristics of the GTO thyristor having the above construction are due to the gate/cathode short which results from the creation of the pinhole in the oxide film within the bonding pad zone 200B.

A similar problem is encountered in large current switching transistors. The transistor is equivalent to the structures of FIGS. 1A, 1B, 2A and 2B with the exception that the P emitter region 104 or 204 is eliminated and the N base region 105 or 205 acts as an N collector region. Also, the region 106 or 206 serves as the transistor base, and the electrode 103 or 203 serves as a base electrode instead of a gate electrode. In order to assure rapid turn-off of a large current, the base of a transistor may preferably be biased reversely. When the base electrode 103 or 203 is biased reversely, an area of a base region 106 or 206 in close proximity to the base electrode is initially turned off to take a non-conducting state. In the case of the continuous emitter structure, an area of the base region remote from the base electrode maintains a conductive state during the transient state. The current concentration is then caused by a rise in the emitter/collector voltage, giving rise to the tendency to breakdown of the transistor. In the case of the split emitter structure, the tendency to current concentration is relieved but the emitter/base short tends to occur.

The invention will now be described by referring to preferred embodiments thereof.

Figure 3A:
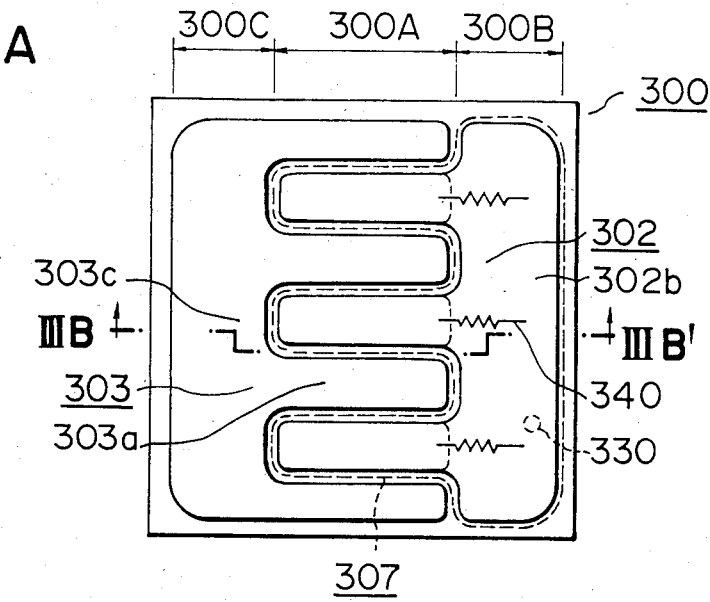
FIG. 3A is a plan view, as seen from the cathode, of one embodiment of a GTO thyristor according to the invention.
Figure 3B:
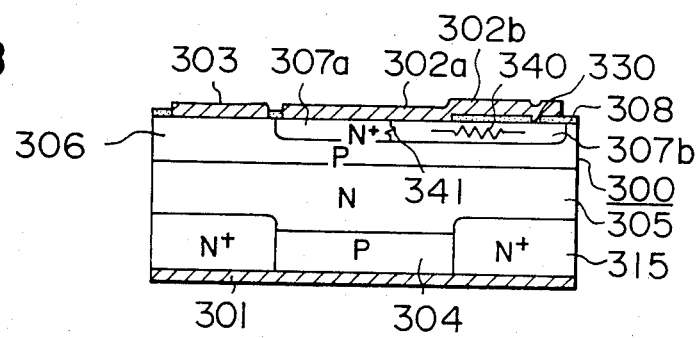
FIG. 3B is a longitudinal sectional view of the GTO thyristor shown in FIG. 3A along the line IIIB—IIIB'.

FIGS. 3A and 3B show a silicon pellet 300 of a GTO thyristor embodying the invention. The pellet 300 comprises a main current switching zone 300A, and bonding pad zones 300B and 300C.

Figure 3C:
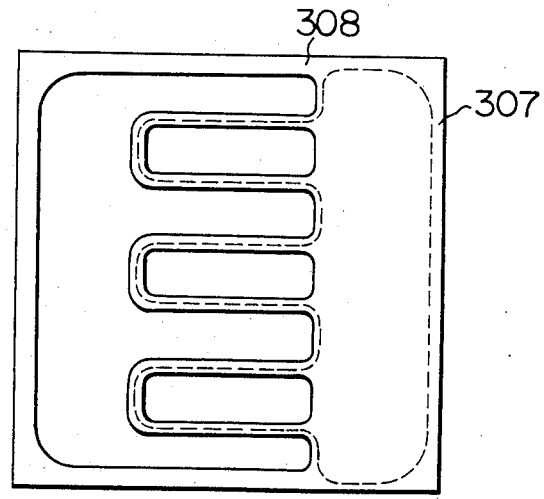
FIG. 3C is a plan view showing a pattern of an oxide film used in the GTO thyristor of FIG. 3A.

Split emitter areas of a P emitter region 304 are each surrounded by an N low-resistivity region 315, and the P emitter region 304 is short-circuited with an N base region 305 through an anode electrode 301 and the N low-resistivity or short-circuiting region 315 to complete a PNPN thyristor of short-circuited emitter type. This N short-circuiting region 315 is adapted to improve turn-off characteristics (see U.S. patent application Ser. No. 74,523) and may otherwise be omitted. The P emitter region 304 is substantially in register with the interdigital areas 307a of an N emitter region 307 through the N base region 305 and a P base region 306. Strictly, however, each split emitter area of the P emitter region 304 is slightly displaced from a corresponding interdigital area 307a in the vertical direction of the sheet of FIG. 3B as has been described in connection with FIGS. 1A and 1B. The N emitter region 307 has substantially the same contour as that of a cathode electrode 302. More specifically, the N emitter region 307 is at least slightly larger than the cathode electrode 302 for preventing short circuit of the cathode electrode with the base region. In the bonding pad zone 300B, an oxide film 308 underlies a bonding pad area 302b of the cathode electrode, and an extension area 307b of the N emitter region 307 underlies the oxide film 308. A gate electrode 303 has, on the P base region 306 within the switching zone 300A, interdigital areas 303a which are juxtaposed with interdigital areas 302a of the cathode electrode 302, and a bonding pad area 303c. The structure of each electrode and the insulating film may be considered similar to that shown in FIGS. 2A and 2B, and the structure of the remaining portion within the silicon substrate may be considered similar to that shown in FIGS. 1A and 1B. The oxide film 308 has a pattern as shown in FIG. 3C. Illustrated by dotted lines, is the contour of the N emitter region 307.

In an example, the substrate 300 is an N type silicon substrate of a thickness of about 310μ, the N base region 305 (in the switching zone 300A) is about 200μ thick and has a resistivity of 100 Ω·cm, the P base region 306 is about 40μ thick with a sheet resistance of about 70 Ω/□ (about 0.3 Ω·cm in resistivity), the N emitter region 307 is about 15μ thick with a sheet resistance of about 3 Ω/□ (about $4.5 \times 10^{-3}$ Ω·cm in resistivity), and the P emitter region 304 is about 55μ thick. The N emitter region 307 is a layer normally having a thickness of about 10μ to about 20μ. The N short-circuiting region 315 is thicker than the P emitter region 304. The insulating film is a silicon oxide film having a thickness of about 1μ. The split areas 307a of the N emitter region 307 have each an area of about 250μ × about 1000μ. The connecting area 302b of the cathode electrode and the connecting area 303c of the gate electrode each have an area of about 700μ × about 3000μ. In this example, a current of about 5A peak could be allowed to flow through each split emitter area. The design parameters have been given hereinbefore for illustration only, and they may be altered extensively for the purposes of application. For example, the thickness of the N emitter region 307 may be about 5μ to about 30μ. Typically, the number of split emitters to be connected mutually by means of one connecting area is 2 to about 20. The insulating layer may be formed of other insulators than silicon oxide and has a thickness selected from a wide range.

According to the foregoing embodiment, the extension area 307b of the N emitter region 307 underlying the cathode connecting area 302b can effectively serve as an electrical resistance to a large current when turning off the device by a gate bias. More specifically, if a large current is subjected to the gate turn-off action within the switching zone 300A and is migrated into the N emitter extension area 307b within the bonding pad zone 300B it must be directed in a lateral direction within the N emitter extension area 307b before reaching the cathode electrode on account of the interposition of the silicon oxide film 308. In this process, the N emitter extension area 307b, which is dimensionally thin, acts as a lateral electrical resistance 340. Since the lateral resistance 340 of the N emitter extension area 307b is sufficiently larger than a longitudinal resistance 341 of the N emitter finger area 307a directly contacting the cathode electrode, it is difficult for current to flow in the lateral direction within the N emitter extension area 307b. In this manner, the current concentration upon the gate turn-off can be suppressed. This suppression effect becomes eminent as the current concentration becomes more intensive or the distance of the current concentration site from the gate electrode 303 increases, because, obviously, the voltage drop across the lateral resistor increases with an increase in the current or an increase in the effective resistor length due to the shift of the current concentration site.

Accordingly, the GTO thyristor according to the foregoing embodiment, though having the N emitter extension area 307b remote from the gate electrode 303, can have a maximum controllable on-state current which is as large as that of the prior art N emitter split type. The GTO thyristor was found to have substantially the same turn-off characteristics as those of the emitter split type as shown in FIGS. 2A and 2B.

Further, according to the structure shown in FIGS. 3A and 3B, even in the presence of a pinhole 330 in the silicon oxide film 308, the N emitter extension area 307b underlying the connecting area 302b of the cathode electrode 302 permits mere contact of the cathode electrode 302 with the N emitter extension area 307b but prevents an electrical short of the cathode electrode 302 with the P base region 306. Generally, the pinhole 330 has a diameter of several microns or less, and the N emitter extension area 307b electrically makes contact with the connecting area 302b of the cathode electrode at a large electrical contact resistance through the pinhole 330. Accordingly, the presence of the pinhole will not allow concentration of a large current when turning off the device. And, only a small percentage of the main current will be allowed to pass through the large electrical contact resistance under the conducting state. As a result, the presence of the pinhole of a normal small size will not adversely affect the operation of the device. As described above, the pinhole 330 which would be created in the silicon oxide film 308 during manufacture process will not lead to the gate/cathode short as encountered in the prior art N emitter split type GTO thyristor and consequent malfunction. A large-diameter pinhole of several tens microns to several hundreds microns may sometimes be created and the presence of such a large pinhole would cause the current concentration upon the gate turn-off. However, such a large pinhole can readily be observed by means of a microscope during appearance inspection of GTO thyristors and a GTO thyristor with such a pinhole can be excluded. Thus, the GTO thyristor according to the foregoing embodiment can be manufactured with high reliability at a yield rate which is as high as the N emitter continuous type.

In the embodiment of FIGS. 3A and 3B, a portion of the interdigital area 307a of N emitter region 307 which is close to the extension area 307b is less controlled by the potential of the gate electrode 303 and tends to be subjected to the current concentration to some extent. To prevent this current concentration, the direct contact area 307a of the N emitter region 307 may preferably be surrounded by the gate electrode in more complete fashion to thereby approximate the structure of the split emitter type as shown in FIGS. 2A and 2B.

Figure 4A:
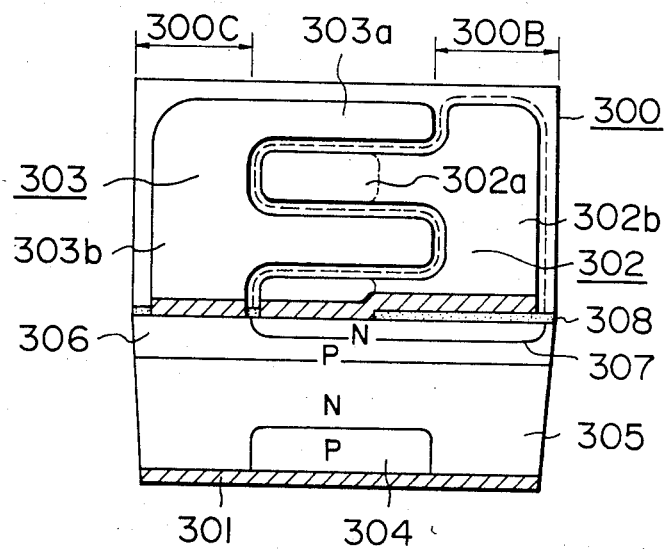
FIG. 4A is a perspective view, partially sectioned at an angle to the surface, of another embodiment of a GTO thyristor according to the invention.
Figure 4B:
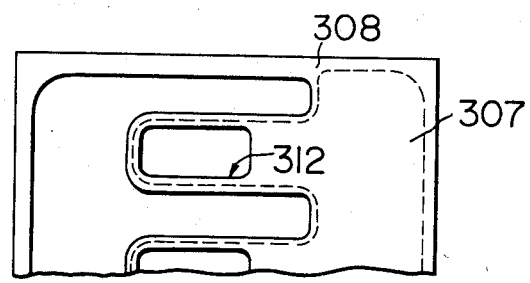
FIG. 4B is a fragmentary plan view showing a pattern of an oxide film used in the GTO thyristor of FIG. 4A.

FIGS. 4A and 4B shows another embodiment of the invention which can prevent the current concentration more efficiently. Especially, FIG. 4B shows a pattern of an oxide film 308 and a contour of an N emitter region 307 underlying the oxide film 308. A contact area 312 through which the N emitter region 307 makes contact to a cathode electrode 302 is formed such that it is confined within interspaces between interdigitally split electrodes 303a of a gate electrode 303. The contact area 312 thus formed can be controlled by the gate electrode 303 efficiently. This structure can be attended by such an auxiliary effect that the resistance between a connecting area 307b of the N emitter region 307 and the cathode electrode 302 can be increased.

The distance by which the gate electrode 303 extends beyond the cathode contact area 312 toward the cathode bonding pad area can preferably be determined in consideration of the expansion of the carrier within the semiconductor and, for example, it may be comparable with or in excess of the diffusion length within a high resistance N base region 305. In the foregoing example, this distance may be about 200μ to about 300μ, for example. In the illustration, a P emitter region 304 has a length larger than that of the contact area 312, but this relation is in no way limitative. A connecting area 302b of the cathode electrode 302 has an area necessary for lead bonding and has a width of about 700μ or more, for example. The base or root portion of each interdigital area 302a of the cathode electrode 302 is insulated from the underlying N emitter region 307 by the insulating film and it corresponds to part of the extension area 302b in the embodiment of FIGS. 3A to 3C.

In the over-oxide structure, there is a shoulder, when viewed in longitudinal section, between an area of the cathode electrode 302 overlying the silicon oxide film 308 and the other area overlying the N emitter region 307. In the case of power semiconductor devices, their properties will sometimes be degraded by electrode migration due to a high current density at the shoulder and the reduced electrode thickness will degrade the surge on-state current.

Figure 5A:
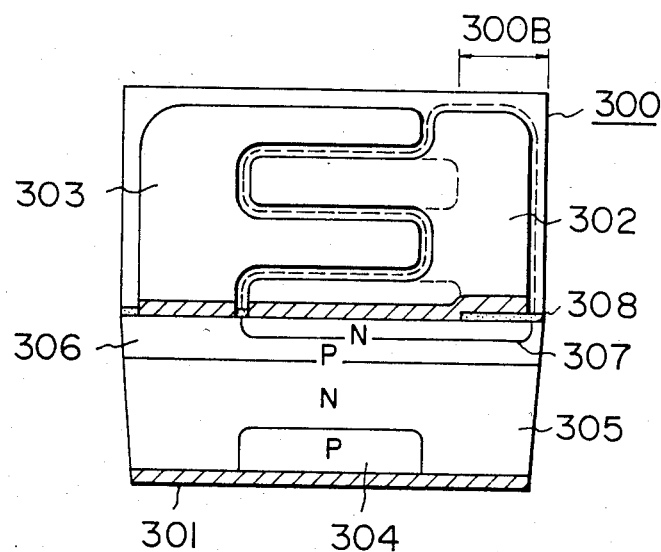
FIG. 5A is a similar perspective view of still another embodiment of a GTO thyristor according to the invention.
Figure 5B:
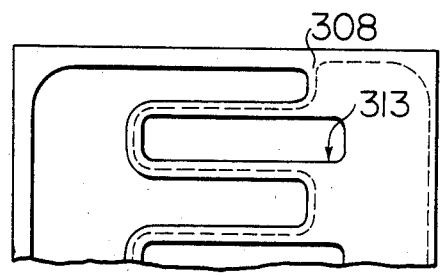
FIG. 5B is a fragmentary plan view showing a pattern of an oxide film used in the GTO thyristor of FIG. 5A.

FIGS. 5A and 5B shows still another embodiment which can cope with the above problem. In this embodiment, a boundary line 313 between each contact area of the cathode electrode and the connecting area overlying a silicon oxide film 308 of the cathode electrode is prolonged by substituting an almost straight line with a deeply bent curve to reduce the current density at the boundary. For example, when the width of the split emitter area is 250μ, the length of each boundary line is about 250μ if the oxide film is almost linearly defined at the inner ends of the split emitter areas (see FIG. 3A). When the oxide film is retracted 250μ from the inner ends of the split emitter areas toward the connecting area as illustrated in FIG. 5A, the length of each boundary line is increased to about three times. The increase in the length of the boundary line may be suitably determined in consideration of the thickness of the electrode film and the rated current. The lead bonding may preferably be effected on the right side of the contact area. In FIGS. 4A, 4B, 5A and 5B, like reference numerals designate like parts in FIGS. 3A and 3B.

Figure 6:
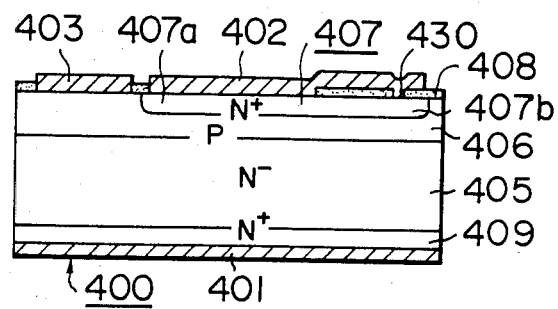
FIG. 6 is a longitudinal sectional view of an NPN transistor embodying the invention.

FIG. 6 shows a transistor embodying the invention. The top view of the transistor is as shown in FIG. 3A. In FIG. 6, reference numerals having the same lower two digits as those of reference numerals in the foregoing Figures are used to designate similar parts. A collector electrode 401 is formed on the almost entire area of one major surface of a silicon chip 400 and makes ohmic contact with an N+ low-resistivity collector region 409. An N− high-resistivity collector region 405 is a bulk region which may occupy the almost whole volume of the chip 400. A P base region diffused from the other major surface of the chip 400 makes ohmic contact to a base electrode 403. Formed in the P base region 406 is an N+ emitter region 407 which has substantially the same thickness as that of the N+ emitter region 409 and makes ohmic contact to an emitter electrode 402. Formed on a common area 407b of the N+0 emitter region 407 is an oxide film 408 which separates the emitter electrode 403 from the common area 407b of the emitter region. Even in the presence of a pinhole 430 in the oxide film 402 the emitter electrode will come into contact with the common emitter area 407b alone and any emitter/base short can be prevented.

When the base electrode 403 is biased reversely by a negative potential to turn off the transistor, positive holes within the base region are drawn by the base electrode, and a potential barrier is formed within the base region. A voltage drop due to current flow within the base region 406 develops so that a site remote from the base electrode 403 is less affected by the reverse bias. Therefore, that site is difficult to turn off. As the emitter/collector voltage rises, excessive current tends to flow into a portion which is kept turned on. However, the current must flow in a lateral direction within the emitter region 407 and the emitter lateral resistance prevents an excessive current concentration.

Apart from the GTO thyristor of P emitter short-circuiting structure and the NPN power transistor, of which the foregoing description has been mainly given, the current concentration is also experienced at the emitter bonding pad in a GTO thyristor of P emitter non-short structure and a PNP power transistor. Such current concentration problem can be eliminated by applying the over-oxide structure of the present invention to the devices of the latter types. The insulating layer interposed between the electrode and the emitter and exemplified as the silicon oxide film in the foregoing embodiments may be of a single layer made of one of a silicon nitride film or a glass or resin thin film or a multilayer of these films. Since the potential difference between the emitter electrode and the emitter region is small, the thickness of the insulating film is of little importance. However, it is general and advantageous from the standpoint of manufacture process to prepare the insulating film along with the formation of other passivation films on the semiconductor surface, and the thickness of the insulating film may be determined by conditions for the other films. Further, an insulating film which is thicker than the emitter electrode, for example, is prone to creation of step cut. In conclusion, the thickness of the insulating film is selected to a value which is free from interference with the other requisition.

Further, the invention may obviously be applicable, in addition to the interdigital structure, to a center gate (center base) pattern structure, a peripheral gate (peripheral base) pattern structure or a circular GTO thyristor (transistor).

What is claimed is:

1. A semiconductor pellet having first and second major surfaces and at least three successive semiconductor layers including a first outermost layer having a first side which is exposed to said first major surface and having a first conductivity type, a first intermediate layer having a second conductivity type opposite to said first conductivity type, said first intermediate layer having a first side which is formed adjacent to a second side of said first outermost layer and including a portion which is exposed to said first major surface, and a third layer having said first conductivity type and having a first side which is formed adjacent to a second side of said first intermediate layer, wherein said first outermost layer includes a common portion exposed to said first major surface and at least tow fingershaped split areas exposed to said first major surface and extending from said common portion wherein said common portion electrically connects said split areas to one another;

an insulating film formed on said common portion at said first major surface; and a first electrode connected with said first outermost layer and including areas which directly make low ohmic contact with said split areas and an area which overlies the common portion only through said insulating film so that said first electrode is insulated from said common portion by said insulating film.

2. A semiconductor device according to claim 1, wherein said portion of said first intermediate layer which is exposed to said first major surface surrounds said first side of said first outermost layer which is exposed to said first major surface.

3. A semiconductor device according to claim 2, wherein said first outermost layer is formed to have a shape which will include a geometric projection of said first electrode projected in a direction vertical to the first and second major surfaces, thereby preventing a short-circuit of said first electrode to said first intermediate layer even upon occurrence of a pinhole in said insulating film.

4. A semiconductor device according to claim 3, wherein said area of the first electrode overlying the insulating film has an area sufficient for bonding a lead wire and the common portion of said first outermost layer underlying the insulating film has a lateral resistance which is larger than a longitudinal resistance of an area of at least two finger-shaped split areas ohmically contacting said first electrode.

5. A semiconductor device according to claim 3, wherein said third layer comprises a second intermediate layer of said first conductivity type having a first side formed adjacent to said second side of said first intermediate layer, wherein said pellet further comprises a second outermost layer of said second conductivity type having a first side formed adjacent to a second side of said second intermediate layer and having a second side which is exposed to said second major surface, and wherein said device further comprises a second electrode coupled to make low ohmic contact with said second side of said second outermost layer and a control electrode coupled to make ohmic contact with said portion of said first intermediate layer which is exposed to said first major surface.

6. A semiconductor device according to claim 3, wherein said third layer comprises a second outermost layer which has a first side formed adjacent to said second side of said first intermediate layer and which has a second side exposed to said second major surface, and further wherein said device comprises a second electrode coupled to make low ohmic contact with said second side of said second outermost layer and a control electrode coupled to make low ohmic contact with said portion of said first intermediate layer which is exposed to said first major surface.

7. A semiconductor device according to claim 3, wherein said insulating film is made of one material selected from the group consisting of silicon oxide, silicon nitride, glass, resin and combinations thereof.

8. A semiconductor device according to claim 5, wherein said second intermediate layer surrounds said second outermost layer and is exposed to said second major surface.

9. A semiconductor device according to claim 8, wherein said second intermediate layer includes a high resistivity region adjacent to the second side of said first intermediate layer and separated from said first and second major surfaces and a low resistivity region disposed between said high resistivity region and said second major surface.

10. A semiconductor device according to claim 9, wherein said low resistivity region has a larger dimension perpendicular to said major surfaces than said second outermost layer.

11. A semiconductor device according to claim 8, wherein said second outermost layer includes at least two split areas which are substantially in register with said at least two finger-shaped split areas of said first outermost layer.

12. A semiconductor device according to claim 3, wherein said third layer is an outermost layer disposed between said first intermediate layer and said second major surface, and wherein said first outermost layer, said first intermediate layer and said third layer form an emitter, a base and a collector region, respectively, of a bipolar transistor.

13. A semiconductor thyristor device including a first semiconductor region having a first conductivity type, a second semiconductor region disposed adjacent to the first region and having a second conductivity type which is opposite to said first conductivity type, a third semiconductor region disposed adjacent to the second region and having said first conductivity type and a fourth semiconductor region disposed adjacent to the third region and having said second conductivity type, and provided with a first and a second current electrode formed on said first and said fourth semiconductor regions, respectively, for allowing a current to flow therebetween, through said first, second, third and fourth regions, said thyristor device comprising:

said second region having a first major surface;

said first region formed in the second semiconductor region and exposed to said first major surface, the first region including a common portion exposed to said first major surface and at least two finger-shaped portions exposed to said first major surface and extending from said common portion, wherein said common portion electrically connects said finger-shaped portions to one another;

the first current electrode disposed on said first region at said first major surface and having a common portion and at least two finger-shaped portions which extend from said common portion and which make ohmic contacts with said finger-shaped portions of the first region; and an insulating film disposed between said common portion of the first semiconductor region and said common portion of the electrode, wherein said common portion of said first electrode overlies said common portion of the first semiconductor region only through said insulating film so that said first electrode is insulated from said common portion of said first electrode by said insulating film.

14. A semiconductor thyristor device according to claim 13, wherein said common portion of said first current electrode has dimensions sufficient for lead bonding and said first region is registered with said first current electrode and has an area at said first major surface which area includes a geometric projection of said first current electrode projected in a direction perpendicular to said first major surface.

15. A semiconductor thyristor device according to claim 14, further including a control electrode disposed on said second region for controlling the current, the third semiconductor region having a second major surface, and the fourth semiconductor region formed in said third semiconductor region, exposed to said second major surface, and being substantially in register with said finger-shaped portions of said first region.

16. A semiconductor thyristor device according to claim 15, wherein said insulating film defines contact areas at said first major surface at which said first current electrode makes ohmic contact with said first region and wherein each of said contact areas extends a predetermined distance into said common portion of the first region and has a predetermined curved boundary within said common portion at said first major surface.

17. A semiconductor thyristor device according to claim 15, wherein said insulating film defines contact areas at which said first current electrode make ohmic contact with said first region, said control electrode and said first current electrode have an interdigital configuration, and said contact areas are confined within interspaces between finger-shaped portions of said control electrode.

18. A semiconductor bipolar transistor device including an emitter semiconductor region having a first conductivity type, a base semiconductor region disposed adjacent to the emitter region and having a second conductivity type which is opposite to said first conductivity type, and a collector semiconductor region disposed adjacent to the base region and having said first conductivity type, and provided with an emitter and a collector electrode formed on said emitter and said collector semiconductor regions, respectively, for allowing a current to flow therebetween, comprising:

said base region having a first major surface;

said emitter region formed in the base semiconductor region and exposed to said first major surface, the emitter region including a common portion exposed to said first major surface and at least two finger-shaped portions exposed to said first major surface and extending from said common portion, wherein said common portion electrically connects said finger-shaped portions to one another;

said collector region having a second major surface on which said collector electrode is disposed;

the emitter electrode disposed on and within an area of said emitter region at said first major surface and having a common portion and finger-shaped portions which extend from said common portion and which make ohmic contact with said finger-shaped portions of the first region; and an insulating film disposed between said common portion of the first semiconductor region and said common portion of the first electrode, wherein said common portion of said first electrode overlies said common portion of the first semiconductor region only through said insulating film so that said first electrode is insulated from said common portion of said first electrode by said insulating film.

* * * * *